(12) United States Patent
Dai et al.

(10) Patent No.: US 11,843,396 B2
(45) Date of Patent: Dec. 12, 2023

(54) DECODING METHOD AND APPARATUS, NETWORK DEVICE, AND STORAGE METHOD

(71) Applicant: SANECHIPS TECHNOLOGY CO., LTD., Shenzhen (CN)

(72) Inventors: Li Dai, Shenzhen (CN); Zhenwei Guo, Shenzhen (CN); Bo Deng, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/789,265

(22) PCT Filed: Dec. 28, 2020

(86) PCT No.: PCT/CN2020/140278
§ 371 (c)(1),
(2) Date: Jun. 27, 2022

(87) PCT Pub. No.: WO2021/129877
PCT Pub. Date: Jul. 1, 2021

(65) Prior Publication Data
US 2023/0031031 A1      Feb. 2, 2023

(30) Foreign Application Priority Data

Dec. 26, 2019   (CN) .......................... 201911370321.X

(51) Int. Cl.
*H03M 13/00*   (2006.01)
*H04L 1/00*    (2006.01)
(Continued)

(52) U.S. Cl.
CPC ........ *H03M 13/635* (2013.01); *H04L 1/0047* (2013.01); *H04L 1/0067* (2013.01);
(Continued)

(58) Field of Classification Search
CPC ... H03M 13/635; H04L 1/0047; H04L 1/0067
See application file for complete search history.

(56) References Cited

U.S. PATENT DOCUMENTS

2010/0158053 A1   6/2010   Kim
2011/0145670 A1   6/2011   Fan
(Continued)

FOREIGN PATENT DOCUMENTS

CN   105680983 A   6/2016
CN   107248904 A   10/2017
(Continued)

OTHER PUBLICATIONS

International Search Report for corresponding application PCT/CN2020/140278 filed Dec. 28, 2020; dated Mar. 31, 2021.
(Continued)

*Primary Examiner* — Joseph D Torres
(74) *Attorney, Agent, or Firm* — CANTOR COLBURN LLP

(57) ABSTRACT

A decoding method and apparatus, a network device, and a storage medium are provided. The method includes: receiving data before de-interleaving and soft bit encoding locations; dividing the data before de-interleaving to obtain first data banks; acquiring punctured data, and obtaining second data banks according to the punctured data, wherein the data before de-interleaving and the punctured data are determined in encoded data according to the soft bit encoding locations; and performing decoding according to the soft bit encoding locations, the first data banks and the second data banks, so as to obtain decoded data.

13 Claims, 5 Drawing Sheets

(51) Int. Cl.
 *H03M 13/27* (2006.01)
 *H03M 13/45* (2006.01)
(52) U.S. Cl.
 CPC .......... *H03M 13/276* (2013.01); *H03M 13/45* (2013.01); *H03M 13/6362* (2013.01)

(56) References Cited

U.S. PATENT DOCUMENTS

2011/0185367 A1 7/2011 Lee
2016/0149590 A1 5/2016 Bao
2018/0278370 A1 9/2018 Jeong
2021/0119848 A1* 4/2021 Ibars Casas .......... H04L 1/0052

FOREIGN PATENT DOCUMENTS

| CN | 108011691 A | 5/2018 |
| CN | 108574562 A | 9/2018 |
| KR | 20130001098 A | 1/2013 |
| WO | 2019112745 A1 | 6/2018 |

OTHER PUBLICATIONS

European Search Report for corresponding application EP20907202; Report dated Jan. 10, 2023.

* cited by examiner

DECODING METHOD AND APPARATUS, NETWORK DEVICE, AND STORAGE METHOD

CROSS REFERENCE

This application is a National Stage Filing of the PCT International Application No. PCT/CN2020/140278 filed on Dec. 28, 2020, which claims priority to Chinese Application No. 201911370321.X filed on Dec. 26, 2019, the entirety of which is herein incorporated by reference.

TECHNICAL FIELD

The present disclosure relates to the field of communications, and in particular to a decoding method and apparatus, a network device, and a storage medium.

BACKGROUND

In a communication system, the function of rate matching is to adjust a code rate output by a channel encoder, so that the number of bits output by a rate matching module is consistent with the number of bits that can be carried by physical resources allocated by the system. A rate matching process is generally accompanied by interleaving, which is used for scrambling encoded data to discretize errors when signal errors occur, so as to reduce the difficulty of error correction processing, thereby protecting the encoded data to improve the stability of encoding performance.

A 3rd-Generation Partnership Project (3GPP) New Radio (NR) protocol uses a Low Density Parity Check Code (LDPC) on uplink and downlink service channels. After encoding, rate matching is performed at first, and then interleaving is performed. A Code Block (CB) is used as the unit in the processes of rate matching and interleaving. The rate matching adopts a rate matching mechanism based on a cycle buffer, and the interleaving adopts common grouped interleaving of R rows and C columns. De-interleaving and de-rate matching are inverse processes of rate matching and interleaving. In order to meet the throughput requirements, in the LDPC decoding process, Zc soft bits are usually read and processed within one period, that is, a de-rate matcher or a decoder needs to combine the Zc soft bits together, which indirectly requires addressing operations such as x/Zc or x % Zc in the de-rate matching process, wherein x represents the location of the soft bit in the decoder, and Zc represents a lifting size used in LDPC encoding, which corresponds to 8 values, all of which are prime numbers, making the implementation of this addressing operation very complex.

SUMMARY

The present disclosure provides a decoding method and apparatus, a network device, and a storage medium.

An embodiment of the present disclosure provides a decoding method, including: receiving data before de-interleaving and soft bit encoding locations; dividing the data before de-interleaving to obtain first data banks; acquiring punctured data, and obtaining second data banks according to the punctured data, wherein the data before de-interleaving and the punctured data are determined in encoded data according to the soft bit encoding locations; and performing decoding according to the soft bit encoding locations, the first data banks and the second data banks, so as to obtain decoded data.

An embodiment of the present disclosure provides a decoding apparatus, including:
a data before de-interleaving receiving module, configured to receive data before de-interleaving and soft bit encoding locations;
a first data bank generation module, configured to divide the data before de-interleaving to obtain first data banks;
a second data bank generation module, configured to acquire punctured data, and obtain second data banks according to the punctured data, wherein the data before de-interleaving and the punctured data are determined in encoded data according to the soft bit encoding locations; and
a decoded data determining module, configured to perform decoding according to the soft bit encoding locations, the first data banks and the second data banks, so as to obtain decoded data.

An embodiment of the present disclosure provides a network device, including: at least one processor and a memory, wherein the at least one processor is configured to execute a program stored in the memory, so as to implement any one of the methods in the embodiments of the present disclosure.

An embodiment of the present disclosure provides a storage medium, wherein a computer program is stored in the storage medium, and when executed by a processor, the computer program implements any one of the methods in the embodiments of the present disclosure.

With regard to the above embodiments and other aspects of the present disclosure, as well as implementations thereof, further explanation will be provided in the Brief Description of the Drawings, the Detailed Description and the Claims.

DETAILED DESCRIPTION

In order to make the objectives, technical solutions and advantages of the present disclosure clearer, the embodiments of the present disclosure will be described in detail below in combination with the drawings. It should be noted that, the embodiments in the present disclosure and features in the embodiments can be arbitrarily combined with each other under the condition of no conflict.

Figure 1:
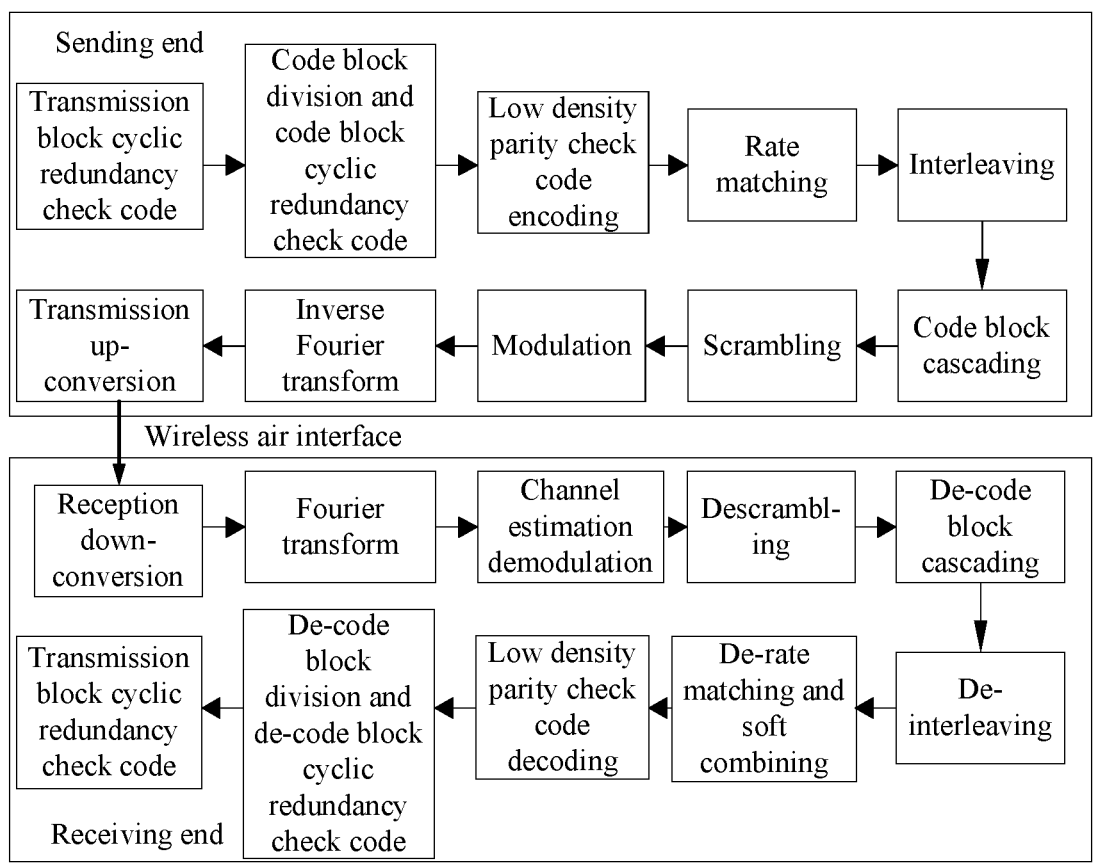
FIG. 1 is a flow diagram of interaction between a sending end and a receiving end in an embodiment of the application.

Before introducing the technical solutions provided by the embodiments of the present disclosure, for the convenience of understanding, data processing involved in a communication process of a sending end and a receiving end will be introduced first, which is specifically shown in FIG. 1.

The sending end generates a Cyclic Redundancy Check (CRC) code according to a transmission block to be sent, divides the transmission block into CBs to serve as transmission banks, and calculates the CRC of each CB. The sending end performs Low Density Parity Check (LDPC) encoding on each code block to obtain encoded data corresponding to the CB, performs rate matching and interleaving on the encoded data in turn, cascades output results, performs scrambling, modulation and inverse fast Fourier transform in turn, transmits the encoded data at a set frequency, and sends the encoded data to the receiving end by means of a wireless air interface.

The receiving end performs fast Fourier transform, channel estimation, demodulation, descrambling and de-code block cascading in turn according to the received data, then performs de-interleaving on the data corresponding to each code block, performs de-rate matching and soft combining on obtained data before de-interleaving, so as to obtain data to be decoded, and then performs LDPC decoding on the data to be decoded to obtain decoded data, wherein the decoded data and the encoded data are the same. Finally, the receiving end performs CRC verification on the obtained code blocks, and performs de-code block division on a plurality of code blocks that have passed the CRC verification, so as to obtain the transmission block. At the same time, the receiving end performs CRC verification on the transmission block, the transmission block that passes the verification is the data actually sent by the sending end, and the receiving end can perform subsequent processing on the data.

It is set that all system bits and CRC check bits of a CB are added up to K' bits, wherein there are L CRC check bits (L>0), and the corresponding sequence is as follows:

$$c_0, c_1, c_2, \ldots c_{K'-1}$$

The current protocol stipulates that there are two types of LDPC matrices: a base graph 1 (BG1) or a base graph 2 (BG2).

After the base graph is determined, an LDPC lifting size Zc used during CB encoding can be uniquely determined according to the base graph.

The lifting size Zc can be determined on the basis of a formula $Zc = a \times 2^j$, wherein $j=0,1,\ldots,7$, and $Zc \leq 384$, at the same time, a is a prime number, and a is any number in a set $\{2, 3, 5, 7, 9, 11, 13, 15\}$. Zc is determined by the sum of information bits and CRC check bits contained in a code block, and the LDPC base graph (the value is 1 or 2).

After LDPC encoding, that is, N bit sequences before rate matching are:

$$d_0, d_1, d_2, \ldots d_{N-1}$$

wherein the system bits are:

$$d_q = c_{q+2Z_c}, q=0,1,\ldots,K'-2Z_c-1$$

Therefore, the system bits can be:

$$c_0, c_1, c_2, \ldots c_{2Z_c-1}$$

The system bits are fixedly punctured and will not be sent to the receiving end. The locations of filler bits (Filler Bits) are (including K-K' filler bits):

$$d_s = \text{<NULL>}, s = K'-2Z_c, \ldots, K-1$$

wherein in the case of the base graph 1, $K=22Z_c$; and in the case of the base graph 2, $K=10Z_c$.

The remaining bits are check bits generated according to the LDPC check matrix.

Secondly, rate matching is performed.

E is set to be the number of bits output after rate matching, and then the rate matching process is:

$k=0;$ $j=0;$ while k<E if $d_{(k_0+j) \bmod N_{cb}} \neq \text{\#<NULL>}$ $e_k = d_{(k_0+j) \bmod N_{cb}};$ $k=k+1;$ end if $j=j+1;$ end while Wherein $N_{cb} \leq N$, and $N_{cb}$ represents the actual size of the cycle buffer in the rate matching based on a limited buffer; and $k_0$ represents the starting location of the rate matching of different redundancy versions, and the size corresponding to $k_0$ (that is, how many soft bits are included between $k_0$ and the $(K'-2Z_c)^{th}$ soft bit) is an integer multiple of Zc.

The number of bits output after rate matching of the code block, that is, the number of bits actually sent by the sending end, must be an integer multiple of $Q_m$.

Thirdly, interleaving is performed:

for j=0 to $E/Q_m-1$ for i=0 to $Q_m-1$ $$f_{i+j*Q_m} = e_{i*\frac{E}{Q_m}+j};$$

end for end for wherein $Q_m$ represents a modulation order, and E represents the number of bits output after rate matching, which is divisible by $Q_m$.

The interleaving is performed by a row-column interleaver, wherein the number of rows is $R=Q_m$; and the number of columns is $C=E/Q_m$.

Finally, code block cascading, scrambling, modulation, layer mapping, inverse fast Fourier transform and other processing are performed, and the processing is sent by an antenna. During modulation, one column and $Q_m$ rows of soft bits are all modulated to the same constellation point.

Embodiment

Figure 2:
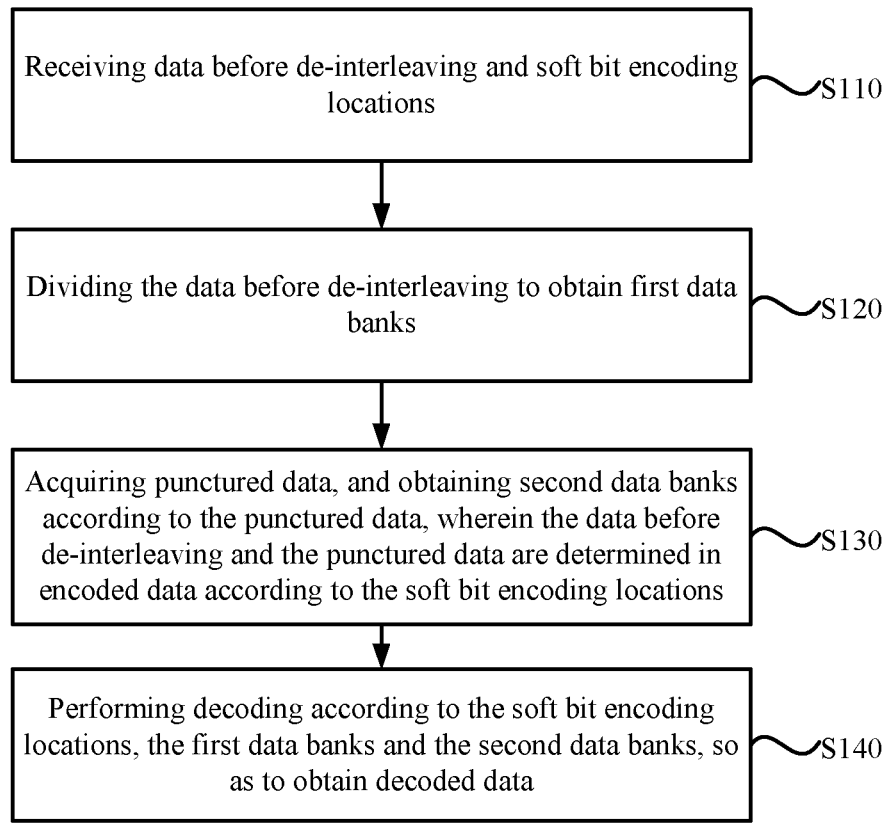
FIG. 2 is a flow diagram of a decoding method in an embodiment of the present disclosure.

FIG. 2 is a flow diagram of a decoding method provided by an embodiment of the present disclosure. The present embodiment can be applicable to the case where de-interleaving and de-rate matching are performed on communication data at a receiving end of the communication data. The method can be executed by a decoding apparatus provided by the embodiment of the present disclosure, and the apparatus can be implemented by the way of software and/or hardware, and can generally be integrated in a network device. As shown in FIG. 2, the method specifically includes:

S110, receiving data before de-interleaving and soft bit encoding locations.

The data before de-interleaving can be soft bits. The data before de-interleaving are actually bit data that are written by a sending end into an interleaving matrix in rows and read out in columns, and one bit of the sending end corresponds to one soft bit of the receiving end. The data before de-interleaving should be the same as interleaving data obtained by the sending end by performing interleaving on a CB. However, since the data are transmitted by an air interface, the data received by the receiving end may be not correct, that is, the data before de-interleaving may be not the same as the interleaving data.

The soft bit encoding locations at least include the location, in encoded data (that is, decoded data), of each soft bit in the data before de-interleaving. The soft bit encoding locations can be determined according to a received interleaving matrix, and can also be directly sent by the sending end to the receiving end. The encoded data are data that are encoded by the sending end and are not subjected to rate matching and interleaving.

A decoding process in the embodiment of the present disclosure refers to a process of performing de-rate matching and soft combining on the received data before de-interleaving to obtain data to be decoded, and performing decoding on the data to be decoded. The data to be decoded are used for decoding to obtain decoded data, and the encoded data are the same as the data to be decoded. In fact, before decoding is performed, it is necessary to restore the encoded data that are not subjected to any processing, so as to achieve accurate decoding.

The soft bit refers to a bit that the receiving end directly outputs an analog quantity for quantization without making a decision after receiving a signal.

S120, dividing the data before de-interleaving to obtain first data banks.

The first data bank includes at least two soft bits, is used for combining the soft bits, and is used as a processing bank of de-rate matching and soft combining for processing.

The division of the data before de-interleaving actually means grouping all soft bits included in the data before de-interleaving.

S130, acquiring punctured data, and generating second data banks according to the punctured data, wherein the data before de-interleaving and the punctured data are determined in the encoded data according to the soft bit encoding locations.

The order of S120 can be adjusted with S130, and can be performed after S130 or simultaneously with S130, which is not specifically limited in the present embodiment of the present disclosure.

In fact, the rate matching in the present embodiment of the present disclosure refers to that the sending end repeats the bits or punctures the bits to match the bearing capacity of a physical channel. Puncturing is to knock out the bits that cannot be carried by the physical channel as redundant data, and at the same time, the following soft bits are moved forward by one bit in turn; and repeating is to achieve an effect of repetition by cyclically fetching numbers in a buffer, and the repeated bits are not adjacent to each other. De-rate matching is opposite, and is to restore the knocked out bits and combine the repeated bits, wherein puncturing and repeating are optional. The rate matching in the embodiment of the present disclosure is a rate matching mechanism based on a cycle buffer.

The punctured data are soft bits that are knocked out during the rate matching process. The punctured data are combined with the data before de-interleaving to generate data to be decoded, which are the same as the encoded data.

The second data bank includes at least two soft bits, is used for combining the soft bits, is used as a knocked out processing bank in the encoded data, and is combined with the first data bank to form the data to be decoded.

Figure 3:
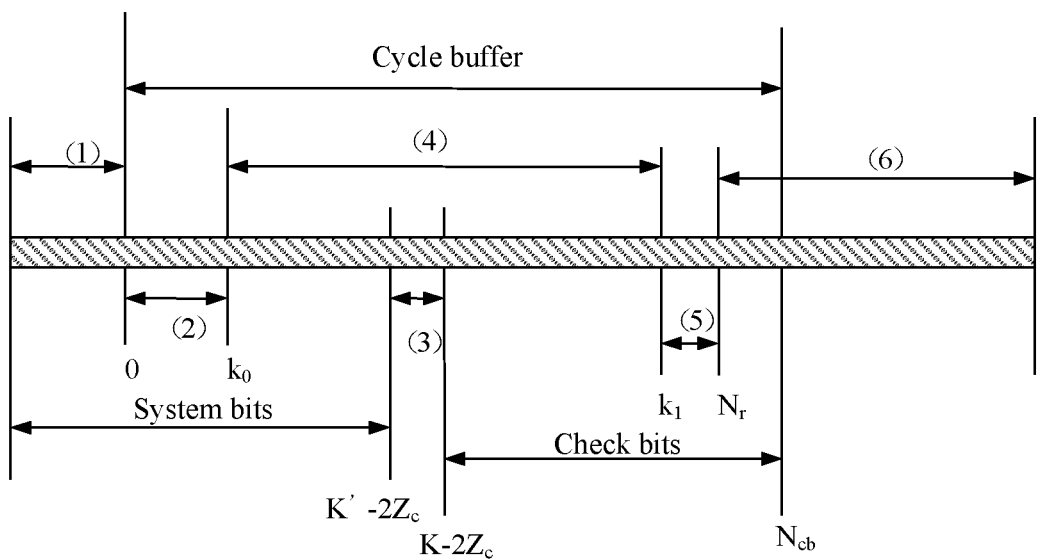
FIG. 3 is a schematic diagram of an encoded data structure in an embodiment of the application.

In fact, the encoded data can be regarded as a soft bit sequence, and the data before de-interleaving are obtained by rate matching, wherein the data deleted from the encoded data belong to the punctured data. As shown in FIG. 3, the encoded data include system bits, filler bits (3) and check bits. In a communication standard, the previous 2Zc bits included in the system bits are fixed as the punctured data. In addition, the system bits may also include other punctured data, and the check bits may also contain other punctured data. It should be noted that, the other punctured data included in the system bits, the punctured data included in the check bits and the filler bits may exist or not. The previous 2Zc bits are fixed as the punctured data, but the restoration operation of the punctured data does not belong to de-rate matching. The restoration operation of the remaining punctured data belongs to de-rate matching.

The soft bit encoding locations include the location, in the encoded data, of each soft bit in the data before de-interleaving, and the location, in the encoded data, of each soft bit in the punctured data. After the rate matching process of the encoded data is completed, operations such as interleaving are then performed. Therefore, for the soft bit encoding locations, the encoded data can determine the punctured data according to the locations, in the encoded data, of the soft bits in the punctured data. The data before de-interleaving can include various forms of data, for example, data formed by acquiring repeated soft bits and performing repetition; data formed by acquiring re-transmitted soft bits; and data formed by acquiring non-repetitive soft bits, etc. The repeated, re-transmitted and non-repetitive soft bits are located in the data before de-interleaving. Therefore, according to the locations of the repeated, re-transmitted and non-repetitive soft bits in the encoded data, the location, in the encoded data, of each soft bit in the data before de-interleaving can be determined, wherein the repeated soft bits actually appear repeatedly, that is, a plurality of soft bits in the data before de-interleaving are located at the same location in the encoded data.

In an exemplary embodiment, a bank length of the first data bank and a bank length of the second data bank are both a target length, the target length is determined according to a lifting size, and the target length satisfies a divisible condition associated with the lifting size.

The target length is used for determining the maximum number of soft bits included in the first data bank and the second data bank. The lifting size can refer to a lifting size used by the encoding of the sending end, and represents the multiple of the expansion of the number of bits.

By configuring the lengths of the banks to be the target length and determining the same according to the lifting size, the length of the bank can be reasonably configured, and at the same time, the length of each bank is the same, which facilitates the addressing of the soft bits in the bank.

In fact, the receiving end processes a CB, and when the CB is decoded correctly, the process of de-interleaving and de-rate matching of the CB is ended.

When a CB is transmitted for the first time, historical combined data stored in the CB in an HARQ are usually cleared to zero. When the processing of the code block associated with the data before de-interleaving is completed, the associated data of the code block can be deleted, or a code block identifier can be added to the associated data of the code block, so as to distinguish the associated data of the code block from the associated data of the next code block, wherein the code block identifier is used for marking a valid interval of each code block.

After receiving all transmitted data, the receiving end stores the data in the HARQ in the format of a cycle buffer, and stores the data in an LDPC decoder in an original order after encoding. Since every decoding processing is for 1 Zc data, one address needs to store Zc soft bits. When the soft bits are stored in the last address, the total number of received soft bits belonging to the last address is less than Zc, and 0 can be padded, so that the number of soft bits of the last address is equal to Zc.

In an optional embodiment, the target length needs to satisfy the divisible condition associated with the lifting size, which indicates that the lifting size can be divisible by the target length, so that the data of one data bank do not belong to different Zcs, thereby ensuring that the data of one data bank will not span 2 Zcs. In cooperation with the storage format in the LDPC decoder, the data of n data banks are exactly equal to the Zc soft bits that can be stored in one address, which ensures that it will not exceed one address, thereby reducing the processing complexity.

In an exemplary embodiment, the target length is a ratio of the lifting size to the power of a set value of 2, the target length is less than or equal to a set number threshold, and the set number threshold is determined according to an operating frequency and available resources.

Exemplarily, the CB uses LDPC encoding, and the lifting size is a lifting size for LDPC encoding.

The lifting size Zc can be determined on the basis of a formula $Zc=a \times 2^j$, wherein $j=0, 1, \ldots, 7$, and $Zc \leq 384$, at the same time, a is a prime number, and a is any number in a set $\{2, 3, 5, 7, 9, 11, 13, 15\}$. Zc is determined by the sum of information bits and CRC check bits contained in a code block, and a LDPC base graph (the value is 1 or 2).

By configuring the lengths of the banks to be the target length and determining the same according to the lifting size, the length of the bank can be reasonably configured, and at the same time, the length of each bank is the same, which facilitates the addressing of the soft bits in the bank.

In an exemplary embodiment, the target length is a ratio of the lifting size to the power of a set value of 2, the target length is less than or equal to a set number threshold, and the set number threshold is determined according to an operating frequency and available resources.

Specifically, the target length is Zs. The set threshold is A, $Zs \leq A$, A is determined according to an operating frequency and available resources, and the set value is m. Specifically, Zs is determined according to the following process:

$Zs=Zc;$ $m=0;$ and if Zs is greater than A, $Zs=Zs/2$, $m=m+1$, and this process is repeated until Zs satisfies $Zs \leq A$.

By determining the target length according to the lifting size, the length of the bank can be reasonably configured, so as to avoid too many or too few soft bits being processed at one time, thereby improving the rate matching efficiency of the soft bits.

S140, performing decoding according to the soft bit encoding locations, the first data banks and the second data banks, so as to obtain decoded data.

The soft bit encoding locations, the first data banks and the second data banks are used for determining the data to be decoded. Specifically, the first data banks and the second data banks can be combined to form the data to be decoded, and the data to be decoded are decoded to obtain the decoded data. It can be understood that, the combination manner needs to know the location relationship between the first data banks and the second data banks, and the locations, in the encoded data (i.e., the data to be decoded), of the soft bits in the first data banks and the second data banks can be determined according to the soft bit encoding locations. Therefore, the first data banks and the second data banks can be arranged according to the location relationship, so as to obtain the data to be decoded.

In an exemplary embodiment, performing decoding according to the soft bit encoding locations, the first data banks and the second data banks, so as to obtain the decoded data includes: determining bank encoding locations of respective first data banks according to the soft bit encoding locations and first soft bits in the respective first data banks; determining bank encoding locations of the second data banks according to the soft bit encoding locations and first soft bits in the second data banks; and respectively storing, according to the bank encoding locations, the first data banks and the second data banks at matched storage addresses in a decoder, so as to arrange the first data banks and the second data banks to form data to be decoded, so that the decoder decodes the data to be decoded.

The first data banks and the second data banks can be regarded as soft bit sequences. The location, in the encoded data, of the first soft bit in the soft bit sequence can be used as the location of the soft bit sequence in the encoded data, that is, the bank encoding location of the bank. The locations of the banks except the first soft bit can be determined according to the order between the soft bits, that is, relative locations, and the bank encoding locations.

Correspondingly, when each bank is stored, the first soft bit is written in the storage address corresponding to the bank encoding location, and the next soft bit is written in an address that offsets by 1 bit from the storage address, then subsequent soft bits are written after the subsequent offset addresses, and so on, and the soft bits in the bank are written into the decoder one by one in turn.

The matched memory addresses in the decoder correspond to the bank encoding locations. The first data banks and the second data banks are respectively stored at matched locations according to the bank encoding locations, so that the first data banks and the second data banks are arranged according to the bank encoding locations at the same time, and the data to be decoded are thus formed by splicing and combining.

By determining the bank encoding locations of the respective first data banks and the second data banks according to the soft bit encoding locations, and correspondingly storing the first data banks and the second data banks in the storage addresses matching the bank encoding locations, the first data banks and the second data banks are arranged and combined in the decoder, so as to ensure accurate de-rate matching, thereby performing accurate splicing to form the data to be decoded.

According to the decoding method and apparatus, the network device and the storage medium provided by the embodiments of the present disclosure, by dividing the soft bits in the data before de-interleaving to form the first data banks, acquiring the punctured data at the same time, and performing soft bit division to generate a plurality of second data banks, forming the data to be decoded according to the soft bit encoding locations, the first data banks and the second data banks, and performing decoding, a bank is formed by a plurality of soft bits for processing, the problem in the prior art is solved that the soft bits need to be processed one by one in a de-rate matching process, resulting in low de-rate matching efficiency, the situation of individually addressing the soft bits one by one in the de-rate matching and decoding processes can be reduced, and the de-rate matching efficiency and the decoding efficiency can be improved.

In an exemplary embodiment, receiving the data before de-interleaving and dividing the data before de-interleaving to obtain the first data banks includes: receiving, in multiple paths in parallel, soft bits output by a de-interleaving matrix in columns; sequentially storing the soft bits received in each path to generate a plurality of third data banks; and sequentially performing soft combining on respective third data banks according to a set period number of clock periods, so as to form the first data banks.

Actually, the data before de-interleaving are obtained from the de-interleaving matrix. The de-interleaving matrix outputs the soft bits in columns, the interleaving matrix includes $Q_m$ rows in total, and outputs $Q_m$ soft bits in each column. The soft bits output in columns before de-interleaving are received in multiple paths in parallel, and each path receives at most one soft bit within one set period number of clock periods. Each path respectively stores the received soft bits according to the receiving order, that is, the soft bits stored in one path are a row of soft bits in de-interleaving matrix.

$Q_m$ serial-to-parallel conversion modules can be configured, the serial-to-parallel conversion modules work in parallel, each serial-to-parallel conversion module processes one row of the de-interleaving matrix to receive the soft bits in multiple paths in parallel, and stores the soft bits in turn, so as to independently complete the collection of the soft bits of the third data bank to form a third data bank. At the same time, according to the locations of the soft bits, the location, in the encoded data, of the first soft bit received in the third data bank is determined, and the location is used as the bank encoding location of the third data bank, and the location is sent to the next processing module together with the formed third data bank for subsequent processing.

The $Q_m$ serial-to-parallel conversion modules can generate third data banks that are an integer multiple of $Q_m$. In the process of processing the third data banks, the third data banks are respectively processed in turn in a serial processing mode.

Soft combining refers to combining based on a Hybrid Automatic Repeat request (HARQ). In fact, after sending a data packet, the sending end needs to wait for the receiving end to feed back a correct reception message, and if there is no feedback, the sending end will re-transmit the data packet or part of the data packet to ensure that the receiving end can receive the correct data packet. After acquiring the third data banks, the receiving end can combine matched buffer data in an HARQ memory, and the combined bank is used as the first data bank, and at the same time, the first data bank is a valid data bank that is correctly transmitted.

The manner of determining the order of serial processing can be: sequentially selecting, from multiple paths, a third data bank formed by one path according to a set rule (such as polling) to serve as a processing bank for processing.

The set period number of clock periods is used as the processing frequency of the third data bank, that is, as the selection frequency of the third data bank formed by selecting one path from multiple paths. The set period number of clock periods can be set as needed. Usually, the duration of one clock period is not enough to complete a processing task of one third data bank, and thus a plurality of clock periods can be selected as a processing period to complete the processing task of one third data bank.

By receiving the soft bits output by the de-interleaving matrix in parallel, and sequentially storing the soft bits to form the third data banks, the soft bits are converted into banks. Meanwhile, the third data banks are processed in series, therefore processing is performed in the form of banks, and the processing efficiency of the soft bits is thus improved.

In an exemplary embodiment, sequentially storing the soft bits received in each path to generate the plurality of third data banks includes: in a case where a received target soft bit satisfies a filler bit starting adjacent condition, generating a current third data bank by taking the target soft bit as the last received soft bit, and continuing to receive the next soft bit to generate the next third data bank.

Actually, the encoded data can include a filler bit, but the filler bit is not in the data before de-interleaving, so when the data before de-interleaving are stored, the location of the filler bit can be reserved in the current third data bank, and the next third data bank is generated according to the next received soft bit, wherein if the target soft bit is exactly the last soft bit in the current third data bank, the current third data bank is directly generated without reserving the location of the filler bit in the current third data bank. A new third data bank is formed according to the next received soft bit, and meanwhile, the next received soft bit is the first soft bit of the third data bank.

In fact, the third data bank can be constructed in advance and is filled with the received soft bits, and meanwhile, the location of the filler bit is not filled with the soft bit so as to reserve the location.

The filler bit starting adjacent condition is used for determining whether the location of the received soft bit in the encoded data after offsetting by the target length is the location of the filler bit. The target soft bit refers to a soft bit whose location in the encoded data after offsetting by the target length is the location of the filler bit. The target soft bit is used for determining whether to stop acquiring the soft bits in the current third data bank. The current third data bank refers to the current third data bank to be generated. The current third data bank can use the target soft bit as the last soft bit received from the data before de-interleaving, and if the target soft bit is the last soft bit in the current third data bank, the current third data bank is directly generated bank; and if not, the location of the filler bit is reserved, and the current third data bank is generated. At this time, the number of soft bits that belong to the data before de-interleaving and are included in the current third data bank is less than the target length.

Actually, the soft bits in the encoded data can be numbered according to the order, and the serial numbers are used as the locations of the soft bits.

Specifically, the filler bit starting adjacent condition includes whether the location of the soft bit in the encoded data is $K'-2Z_c-1$. If the location of the soft bit is $K'-2Z_c-1$, it is determined that the soft bit satisfies the filler bit starting adjacent condition.

The reception of the next soft bit is continued, and the soft bit is used as the first soft bit of the new third data bank, so as to generate the new third data bank.

By reserving the location of the filler bit in the third data bank, it can be ensured that the locations, in the encoded data, of the soft bits in the third data bank are continuous, so that when the third data bank is subsequently arranged, the arrangement can be accurately performed to avoid that a third data bank includes a plurality of discontinuous soft bits, such that the corresponding first data banks need to be divided for arrangement and combination. The arrangement and combination can be directly performed with the first data bank as the unit, thereby improving the processing efficiency of the first data bank.

In an exemplary embodiment, performing soft combining on the third data bank to form the first data bank includes: querying, in a set to be combined and according to the bank encoding location corresponding to the third data bank, a bank to be combined that matches the third data bank, and performing combining to obtain the first data bank; and updating the matched bank to be combined in the set to be combined according to the first data bank, wherein a bank length of the bank to be combined is a target length, the bank to be combined is used for storing historical combined data, and the historical combined data are used to be combined with the soft bits in the third data bank so as to update the soft bits in the third data bank.

The set to be combined is used for storing the historical combined data, and the historical combined data are stored in the form of the bank to be combined. An initial value of the historical combined data is 0, the data transmitted for the first time can be stored in the set to be combined to serve as the historical combined data, if the receiving end can perform correct decoding, subsequent processing is performed on the decoded data obtained by decoding, the data in the set to be combined can be reset, or a new set to be combined can be configured for the next CB. If the receiving end cannot perform correct decoding, the receiving end requests the sending end to re-transmit the data, wherein the re-transmitted data can be all data in the CB, or part of data in the CB. The receiving end performs combining according to the data re-transmitted for the second time and the data stored for the first time, that is, the historical combined data, updates the historical combined data according to the combined data, and performs decoding. If correct decoding is performed, subsequent processing is performed on the decoded data obtained by decoding; and if correct decoding cannot be performed, the request for data retransmission is continued, and the above steps are repeated.

The historical combined data are actually data obtained by combining the historically transmitted data. There may be errors in the data before de-interleaving, and there may be errors in the correspondingly formed third data bank. In this case, correction can be made according to historical combined data to ensure that the correct first data bank is formed.

The set to be combined is located in the HARQ memory, and the storage location of the bank to be combined in the HARQ memory corresponds to the bank encoding location of the third data bank. Thus, the matched bank to be combined can be queried in the HARQ memory according to the bank encoding location of the third data bank.

In fact, soft combining in the embodiment of the present disclosure is to read, from the HARQ memory, the bank to be combined that matches the third data bank. The soft bits in the bank to be combined and the soft bits in the third data bank are in one-to-one correspondence, and are combined in parallel. The soft bits in the third data bank are replaced with the combined soft bits, the obtained first data bank is sent to the decoder for storage, at the same time, a copy is duplicated and written back into the HARQ memory, and the original bank to be combined is updated so as to perform the next soft combining operation.

By configuring the storage address of the bank to be combined in the soft combining set to correspond to the bank encoding location of the third data bank, the bank to be combined that matches the third data bank is accurately queried and combined, so that the soft combining operation is performed with the third data bank as the unit, the efficiency of the soft combining operation is improved, and the data reliability is improved.

In an exemplary embodiment, the set period number is an integer that is the same as a target period number, or is determined according to one-half of the target period number, and the target period number includes the number of clock periods corresponding to a duration that is required starting from performing soft combining on the third data bank to generating the first data bank.

Specifically, it is assumed that the number of clock periods from starting to read a third data bank from the HARQ memory and completing soft combining to finally writing back into the same address is Q, and P can take Q or Q/2, if Q is an odd number, and then P is a value after Q/2 is rounded off. Q is the target period number, and P is the set period number.

By configuring the set period number, the frequency of processing the third data bank can be flexibly realized.

In an exemplary embodiment, the set period number is determined according to one-half of the target period number, and the set period number is an integer; and performing soft combining on the third data bank to form the first data bank includes: in a case of determining, according to the bank encoding location corresponding to the currently processed third data bank and the bank encoding location corresponding to the previous third data bank, that the first data bank obtained by the currently processed third data bank satisfies a repetitive rate matching condition, determining, according to a bank to be combined corresponding to the previous third data bank, the bank to be combined that matches the currently processed third data bank.

The repetitive rate matching condition is used for judging whether the soft bits in the two serially processed consecutive third data banks are the same. Specifically, the judgment can be made according to whether the bank encoding locations corresponding to the two third data banks are the same. If the bank encoding location corresponding to the currently processed third data bank is the same as the bank encoding location corresponding to the previous third data bank, it indicates that the soft bits in the two third data banks are the same, and it is determined that the currently processed third data bank satisfies the repetitive rate matching condition.

In fact, the target period number is the duration from starting to read a third data bank from the HARQ memory and completing soft combining to finally writing back into the same address. The set period number is one-half of the target period number, or a value of one-half that is rounded off, which indicates that in the process of writing back a third data bank into the same address, another third data bank starts to perform processing, that is, starts to read the corresponding bank to be combined from the HARQ memory. At this time, the banks to be combined corresponding to the two third data banks that satisfy the repetitive rate matching condition are actually the same, and the bank to be combined read from the HARQ memory by the second processed third data bank is actually not updated. In this way, the first data bank obtained by the first processed third data bank can be directly combined as the bank to be combined obtained by the second processed third data bank, therefore the processing time of waiting for reading the updated bank to be combined from the set to be combined, and the reading times can be reduced.

In addition, if the set period number is the target period number, at this time, in any two consecutive third data banks, after one third data bank forms the first data bank and is written back, the other third data bank starts the processing. In this way, the repetitive rate matching has no effect on the processing of the two third data banks.

In an exemplary embodiment, acquiring the punctured data and generating the second data banks according to the punctured data includes: generating a plurality of zero setting banks, wherein soft bits in each zero setting bank are zero, a bank length of each zero setting bank is a target length, a total number of soft bits in the plurality of zero setting banks is a product of a lifting size and 2, and the bank encoding location corresponding to each zero setting bank is in front of the bank encoding location corresponding to each first data bank; in a case where there are filler bits in the encoded data, acquiring the filler bits, and generating a filler bank, wherein a bank length of the filler bank is the target length; in a case where there are first data banks that satisfy a repetitive rate matching condition or there are pre-redundancy-version punctured bits in the encoded data, acquiring pre-redundancy-version bits, and generating pre-redundancy-version banks, wherein a bank length of each pre-redundancy-version bank is the target length, and a bank encoding location corresponding to each pre-redundancy-version bank is in front of the bank encoding location corresponding to each first data bank; and in a case where there are first data banks that satisfy the repetitive rate matching condition or there are post-redundancy-version punctured bits in the encoded data, acquiring post-redundancy-version bits, and generating post-redundancy-version banks, wherein a bank length of each post-redundancy-version bank is the target length, and a bank encoding location corresponding to each post-redundancy-version bank is behind the bank encoding location corresponding to each first data bank.

Specifically, as shown in FIG. 3, the encoded data can include zero setting soft bits (1), pre-redundancy-version punctured bits (2), filler bits (3) and post-redundancy-version punctured bits (5), wherein the zero setting soft bits (1) are soft bits that must be included in the encoded data. The encoded data can include at least one or none of the pre-redundancy-version punctured bits (2), the filler bits (3) and the post-redundancy-version punctured bits (5). The actual data sent by the sending end to the receiving end are data (4) before de-interleaving, wherein the data (4) before de-interleaving do not include the filler bits (3). In addition, subsequent data (6) are transmission data behind the present CB.

Generally, the locations of soft bits in the encoded data are counted from 0 in FIG. 3. Since the fixed previous $2Z_c$ soft bits in the encoded data are punctured and will not be sent to the receiving end, statistics can be directly started from the first soft bit behind the previous $2Z_c$ soft bits. $k_0$ represents a starting location of rate matching of different redundancy versions, k1 represents an ending location of the currently transmitted redundancy version, Nr represents a maximum location value, in the cycle buffer, of all soft bits received by the CB in a plurality of received redundancy versions, and Nr≤Ncb. When LDPC encoding is used, in the case of the base graph 1, $K=22Z_c$; and in the case of the base graph 2, $K=10Z_c$. K' represents the sum of information bits and CRC check bits contained in one CB. Ncb represents the ending location of the cycle buffer.

Correspondingly, the zero setting bank is a bank formed by dividing the zero setting soft bits (1), and all soft bits included in the zero setting bank are 0. Furthermore, the bank encoding locations of all zero setting banks are in front of the cycle buffer in the encoded data, that is, in front of the locations, in the encoded data, of the soft bits of the data (4) before de-interleaving, that is, in front of the bank encoding locations of the respective first data banks formed by the data (4) before de-interleaving. Specifically, if the target length is Zs, the number of zero setting banks is 2Zc. The zero setting bank is a data bank formed by the fixed previous 2Zc soft bits in the system bits.

The filler bank is a bank formed by dividing the filler bits (3). The filler bits (3) can be acquired from a local memory and can also be read from the HARQ memory. The filler bits (3) are usually soft bits that are pre-specified by the sending end and the receiving end. At the same time, the filler bits (3) are located between the pre-redundancy-version punctured bits (2) and the post-redundancy-version punctured bits (5), and between the data (4) before de-interleaving, and the bank encoding location of the thus formed filler bank is located between the bank encoding locations of the respective first data banks. Specifically, the starting location of the filler bits (3) in the encoded data is K'−2Zc, the ending location is K−2Zc, and the bank encoding location of the corresponding filler bank is located between K'−2Zc and K−2Zc.

The presence of the first data bank that satisfies the repetitive rate matching condition indicates $E≥N_{cb}-(K-K')$. The presence of the pre-redundancy-version punctured bits (2) in the encoded data indicates that the bank encoding location of the first data bank is 0. The pre-redundancy-version punctured bits (2) can be read from the HARQ memory. The pre-redundancy-version bank is a bank formed by dividing the pre-redundancy-version punctured bits (2). The starting location of the pre-redundancy-version punctured bits (2) in the encoded data is 0, and the ending location is $k_0$, and the bank encoding location of the corresponding pre-redundancy-version bank is located between 0 and $k_0$. At the same time, the pre-redundancy-version punctured bits (2) are in front of the locations, in the encoded data, of the soft bits in the data (4) before de-interleaving, and the bank encoding location of the corresponding pre-redundancy-version bank is in front of the bank encoding location of the first data bank formed by the data (4) before de-interleaving.

The preference of the post-redundancy-version punctured bits (5) in the encoded data indicates $E+k_0≥N_{cb}$. The post-redundancy-version punctured bits (5) can be read from the HARQ memory. The post-redundancy-version bank is a bank formed by dividing the post-redundancy-version punctured bits (5). The starting location of the post-redundancy-version punctured bits (5) in the encoded data is $k_l$, the ending location is $N_r$, and the bank encoding location of the corresponding post-redundancy-version bank is located between $k_l$ and $N_r$. At the same time, the post-redundancy-version punctured bits (5) are behind the locations, in the encoded data, of the soft bits in the data (4) before de-interleaving, and the bank encoding location of the corresponding post-redundancy-version bank is behind the bank encoding location of the first data bank formed by the data (4) before de-interleaving.

By configuring a plurality of second data banks and restoring the same according to different puncturing manners to obtain the second data banks, the accuracy of the restored punctured data is ensured, and at the same time, the restored punctured data are replaced with the soft bits one by one in the form of bank for restoration, such that the speed of de-rate matching is improved.

In addition, the pre-redundancy-version punctured bits can be directly stored in the HARQ memory according to the pre-redundancy-version bank, so that the pre-redundancyversion bank can be directly read from the HARQ memory. In the HARQ memory, the post-redundancy-version punctured bits can be stored directly according to the post-redundancy-version bank, so that the post-redundancy-version bank can be directly read from the HARQ memory.

Figure 4:
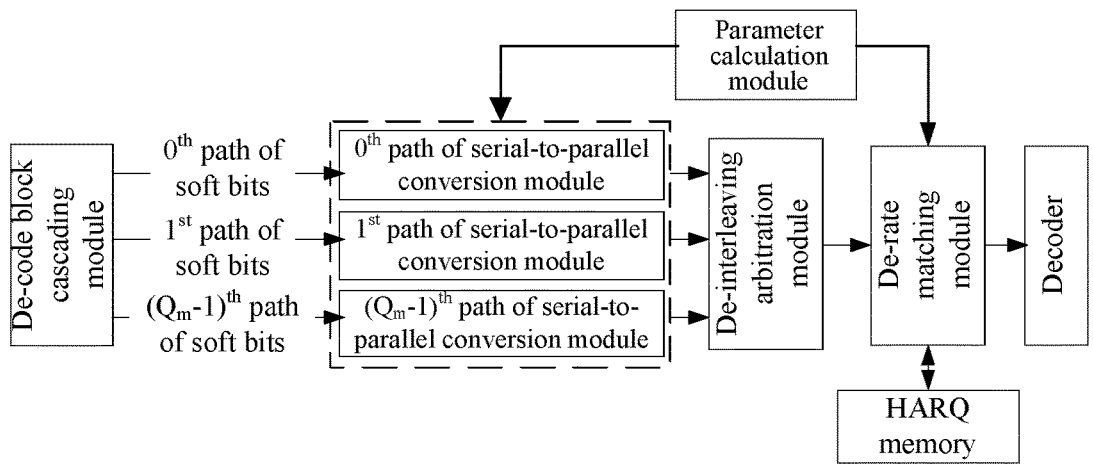
FIG. 4 is a schematic diagram of an application scenario to which an embodiment of the present disclosure is applicable.

In an example, the processing process of each bank can be implemented by the modules shown in FIG. 4.

A de-code block cascading module completes de-code block division, and outputs $Q_m$ soft bits in the same column of the de-interleaving matrix within each clock period. The de-code block cascading module outputs, in columns and in parallel, the soft bits from the de-interleaving matrix to $Q_m$ paths of serial-to-parallel conversion modules.

Each serial-to-parallel conversion module is configured to receive de-code block division data and realize $Q_m$ paths of parallel processing. The collection of Zs soft bits is independently completed in each path, so as to form the third data bank, and the third data bank is sent to a de-interleaving arbitration module for processing.

The de-interleaving arbitration module is configured to select one of the third data banks after $Q_m$ paths of serial-to-parallel conversion are completed, and serially send the same to a de-rate matching module for processing.

The de-rate matching module is configured to complete HARQ combining processing on the first data bank (including Zs soft bits) sent by the de-interleaving arbitration module, and complete de-rate matching (puncturing rate matching).

Figure 5:
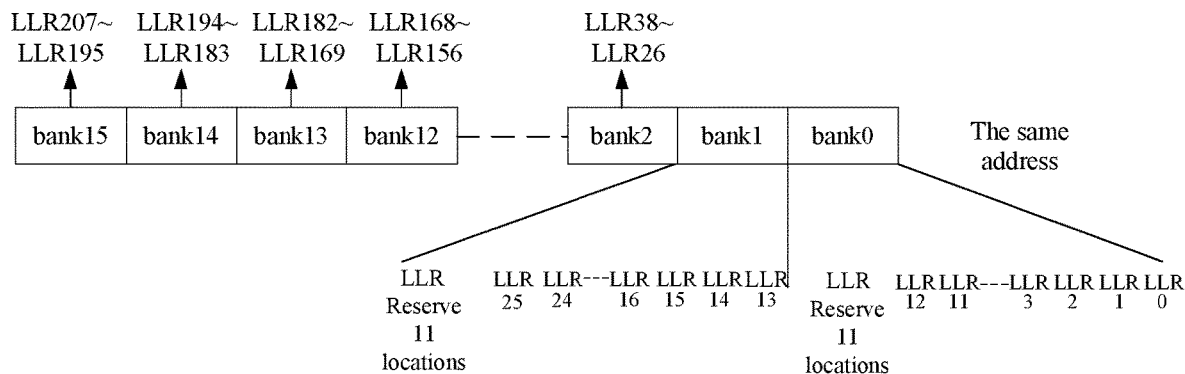
FIG. 5 is a schematic diagram of a soft bit storage format in an embodiment of the application.

The HARQ memory is responsible for providing the bank to be combined for the rate de-matching module, and the decoder is used for decoding, wherein the decoder is an LDPC decoder. Specifically, the storage formats of the soft bits in the LDPC decoder and the HARQ memory are shown in FIG. 5. If Zc=208, Zs=13, that is, each bank (Bank) stores 13 soft bits in turn, and the locations of 11 upper soft bits of each Bank are reserved.

In fact, from the interleaving matrix, for each row, the processing is started after several (i.e., Zs) data are collected. The data collected in different rows are processed in series, which can avoid rewriting and rereading.

Zs is not arbitrarily set. In fact, the decoder performs processing in the unit of processing blocks of Zc data. If Zc cannot be divisible by Zs, the Zs data belong to different processing blocks, which greatly increases the complexity of data processing. Therefore, Zs can be configured to be divisible by Zc to ensure that Zs data will not span two processing blocks, thereby reducing the complexity of data processing.

Specifically, a bank identifier can be configured for each bank, a bit identifier can be configured for each soft bit in the bank, and each soft bit is determined by the bank identifier and the bit identifier. That is, each soft bit in the bank can be determined by querying which bank it is, and then querying which soft bit it is in the bank after the bank is determined.

It can be configured that, each bank with a length Zc includes ($2^m$) banks with lengths Zs. According to the serial number Zs_i of the bank with the length Zs, the address Zs_i>>m in the corresponding bank with the length Zc is directly obtained, and belonging to which bank with the length Zs in the bank with the length Zc can also be directly obtained: Zs_i %($2^m$). Therefore, the addressing of each bank with the length Zs becomes very simple. For example, if Zs is 16, then Zc/Zs=24, Zs_i/24 and Zs_i % 24 need to be calculated, and such calculation is relatively simple, thus simplifying the addressing operation.

Firstly, the target length is calculated: Zs=a×$2^m$, moreover, if Zs≤A is better, and A is taken as 24.

Secondly, parameters related to the starting location of the data before de-interleaving are calculated, that is, which bank the soft bits in the first column of each row in the de-interleaving matrix are located, and the serial number of the soft bit in the bank.

Specifically, it is set that the locations, in the cycle buffer, of each row of soft bits in the de-interleaving matrix are ks[i], then:

$ks\_nZs[i]$=floor $(ks[i]/Zs)$ $ks\_oZs[i]=ks[i]\% Zs$ wherein i=0,1, . . . Qm−1.

Correspondingly, the bank to which the ending location $k_0$ of the currently transmitted redundancy version belongs is:

$k1_{nZs[i]}$=floor$(k1/Zs)$

Thirdly, the relative locations K' and K of the filler bits, the bank to which the soft bit at a finite cycle buffer rate matching location Nib and the serial number of the soft bit in the bank are calculated:

$Kp\_nZs[i]$=floor $((K'-2Zc)/Zs)$ $Kp\_oZs[i]=K'\%Zs$ $K\_nZs[i]$=floor $((K-2Zc)/Zs)$ $K\_oZs[i]=K\%Zs$ $Ncb\_nZs[i]$=floor$(Ncb/Zs)$ $Ncb\_oZs[i]=Ncb\%Zs$ Finally, the bank to which the actually used cycle buffer size Nr belongs is calculated:

$Nr\_nZs[i]$=floor$(Nr/Zs)$ (1) De-Interleaving Process:

A previous stage demodulation module: since the demodulation of one constellation point of each layer corresponds to $Q_m$ soft bits, and the $i^{th}$ soft bit corresponds to the $i^{th}$ row of the de-interleaving matrix, i takes 0, 1, . . . $Q_m$−1. The demodulation module of each cycle may simultaneously output nL layers of soft bits, and nL can be valued as 1, 2, 3 or 4. A descrambling module performs serial processing on the nL layers, and sequentially outputs the soft bits of one layer within each clock period.

$Q_m$ serial-to-parallel conversion modules work in parallel, each serial-to-parallel conversion module processes the $i^{th}$ path of soft bits, each path receives at most 1 soft bit within each clock period, and i takes 0, 1, . . . $Q_m$−1.

The purpose of the serial-to-parallel conversion is to collect Zs soft bits according to an address a and an offset address, so as to form a bank, which is used as the processing unit of subsequent de-rate matching and HARQ processing. The soft bits in the $i^{th}$ bank with the length Zs are:

$Zs\times a+m, m=0,1, \ldots Zs-1.$

The $Q_m$ serial-to-parallel conversion modules work independently, and the specific processing is as follows:

before the arrival of CB data, the initialization processing of the $Q_m$ serial-to-parallel conversion modules is completed; and each bank includes an address a and offset counters o, where the address a is the bank encoding location.

The initialization is specifically:

$a=ks\_nZs[i]$ $o=ks\_oZs[i]$

The memory associated with the serial-to-parallel conversion module is cleared to zero; and after the initialization is completed, the soft bits are cyclically waited until each serial-to-parallel conversion module has collected and processed $E/Q_m$ soft bits, and the de-interleaving processing of the CB is ended.

Every time when the previous stage module sends one soft bit, the soft bit is stored in the $o^{th}$ location of the bank, the address a and the offset o of the bank are updated, the initial value of o is 0, and the processing is sequentially performed as follows:

ar=a;

o=o+1; and flag=1.

If o is equal to Zs, it indicates that the collection of a bank is ended, then the collected Zs soft bits are sent to the de-interleaving arbitration module as a third data bank, and the address ar is sent to the de-interleaving arbitration module as the bank encoding location, then the memory associated with the serial-to-parallel conversion module is cleared to zero, and flag is set to 0; and at the same time, o is set to 0, and a=a+1.

If o is equal to Kp_oZs[0] and a is equal to Kp_nZs[0], it indicates that the next soft bit of the current soft bit in the encoded data is at the starting location of the filler bit and needs to be skipped, that is, the next received soft bit is a soft bit behind the ending location of the filler bit. If flag is equal to 1, the soft bit stored in the serial-to-parallel conversion module is sent to the de-interleaving arbitration module as a third data bank, and the address ar is sent to the de-interleaving arbitration module as the bank encoding location, then the memory associated with the serial-to-parallel conversion module is cleared to zero, and flag is set to 0; and at the same time, o is set to K_oZs, and a=K_nZs.

If o is equal to Kp_oZs[0], and a is equal to Kp_nZs[0], it indicates that the next soft bit of the current soft bit in the encoded data is at the starting location of the filler bit, that is, at the location corresponding to K'−2Zc in FIG. 3, and needs to be skipped, that is, the next received soft bit is a soft bit behind the ending location of the filler bit. If flag is equal to 1, the soft bit stored in the serial-to-parallel conversion module is sent to the de-interleaving arbitration module as a third data bank, and the address ar is sent to the de-interleaving arbitration module as the bank encoding location, then the memory associated with the serial-to-parallel conversion module is cleared to zero, and flag is set to 0; and at the same time, o is set to K_oZs, and a=K_nZs, that is, the location corresponding to K−2Zc in FIG. 3.

If o is equal to Ncb_oZs, and a is equal to Ncb_nZs, it indicates that the current soft bit is at the ending location of the cycle buffer, that is, at the location corresponding to Ncb in FIG. 3, and needs to be circulated to the location 0. If flag is equal to 1, the soft bit stored in the serial-to-parallel conversion module is sent to the de-interleaving arbitration module as a third data bank, and the address ar is sent to the de-interleaving arbitration module as the bank encoding location, then the memory associated with the serial-to-parallel conversion module is cleared to zero, and flag is set to 0; and at the same time, o is set to 0, and a is also set to 0.

(2) De-Interleaving Arbitration:

The de-interleaving arbitration module records the serial numbers of one or more paths to be processed according to the writing conditions of $Q_m$ paths of serial-to-parallel conversion modules. Then, within every P clock periods (P>0), the de-interleaving arbitration module sequentially selects, according to a polling mechanism, a path of third data banks from multiple paths of third data banks, and sends the same and the bank encoding location ar to the de-rate matching module for processing. The serial number of the selected path is cleared from tasks to be processed.

Figure 6:
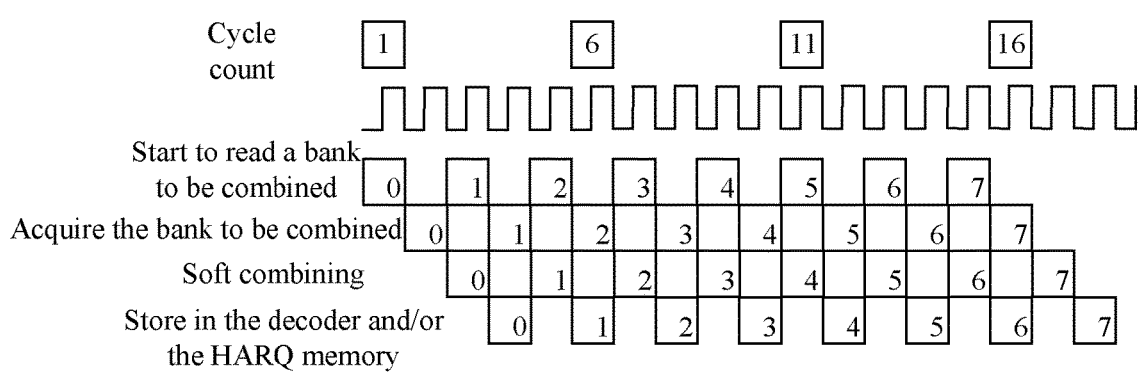
FIG. 6 is a time sequence diagram of bank processing in an embodiment of the present disclosure.

Preferably, Q is 4, and P is 2. The specific time sequence is shown in FIG. 6. It is judged whether two consecutively processed third data banks in serial processing have the same address ar, if the addresses are the same, it is repetitive rate matching, then the latter third data bank does not read the bank to be combined from the HARQ memory, and directly uses the combined result of the previous third data bank, that is, the formed first data bank continues to combine. If the addresses are different, the latter third data bank only needs to read data from the HARQ. In this way, in the repetitive rate matching, it is only necessary to judge whether the two consecutively processed third data banks are repetitive, thereby greatly simplifying the judgment and processing of the repetitive rate matching.

Figure 7:
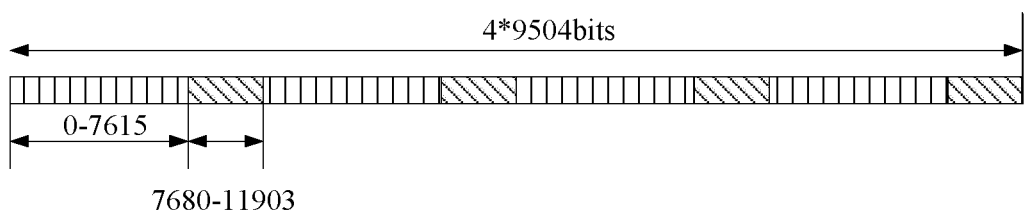
FIG. 7 is a schematic diagram of data after rate matching in an embodiment of the present disclosure.
Figure 8:
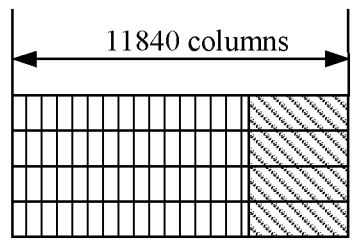
FIG. 8 is a schematic diagram of one interleaving matrix in an embodiment of the present disclosure.
Figure 9:
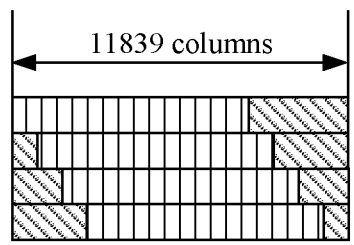
FIG. 9 is a schematic diagram of another interleaving matrix in an embodiment of the present disclosure.

In an example, K'=8384, Zc=384, $N_{cb}$=11904, correspondingly, the encoded data formed by LDPC encoding include 8448*3+2*384 soft bits, wherein the previous $2Z_c$=768 soft bits are knocked out as punctured data, the intermediate (8384-8447)$^{th}$ soft bits are filler soft bits, which are knocked out as the punctured data, the knocked out soft bits are renumbered, the previous 0-767 soft bits are knocked out, the soft bit encoding location is redetermined as 0 starting from the 768$^{th}$ soft bit, at this time, the data after the data are knocked out are 0-9567, wherein the filler bits are 7616-7679, the remaining soft bits are 0-7615 and 7680-9567. After rate matching, the filler bits are knocked out, and the operation is performed on the remaining soft bits for 4 times to form data subjected to rate matching. As shown in FIG. 7, the data subjected to rate matching include 4*11840 bits in total, that is, the number of actually sent bits is 4*11840. The data subjected to rate matching are interleaved, that is, are written in rows and read out in columns. As shown in FIG. 8, the interleaving matrix has 4 rows (the same as the number of cycles) and 11840 columns in total. As shown in FIG. 9, the interleaving matrix has 4 rows (the same as the number of cycles) and 11839 columns in total.

With regard to FIG. 8, the rows in the interleaving matrix are 0-7615 (an area filled with vertical lines) and 7680-11903 (an area filled with oblique lines), that is, the soft bits in different rows, but the same column of the interleaving matrix are stored at the same location. With regard to FIG. 9, the rows in the interleaving matrix are respectively: 0-7615 (an area filled with vertical lines), and 7680-11902 (an area filled with oblique lines); 11903 (an area filled with oblique lines), 0-7615 (an area filled with vertical lines), and 7680-11901 (an area filled with oblique lines); 11902-11903 (an area filled with oblique lines), 0-7615 (an area filled with vertical lines), and 7680-11900 (an area filled with oblique lines); 11901-11903 (an area filled with oblique lines), 0-7615 (an area filled with vertical lines), and 7680-11899 (an area filled with oblique lines), that is, the soft bits in different rows and different columns of the interleaving matrix are stored at the same location. In the prior art, when repetitive de-rate matching is performed, it is necessary to perform judgment row by row, but in the case of FIG. 9, it is also necessary to query the soft bits stored at the same location row by row according to the column offset condition.

However, in the embodiment of the present disclosure, the soft bits in each row are received in parallel within one clock period and are processed in series, that is, after serial processing is performed on the data banks obtained by different rows respectively, it is only necessary to judge whether the bank encoding locations of two adjacent banks with the lengths Zs are the same in the processing process at most, if so, the next bank with the length Zs is directly combined on the combining result corresponding to the previous bank with the length Zs, without querying and reading the corresponding bank to be combined from the set to be combined again, thereby saving and time and the processing data volume required for querying and reading the bank to be combined from the set to be combined.

As shown FIG. 8, the soft bits output by the interleaving matrix are respectively 0, 0, 0, 0, 1, 1, 1, 1, 2, 2, 2, 2 . . . At this time, in the serial processing process, four instances of consecutive processing correspond to the data bank with the bank encoding location 0. Therefore, it is not necessary to consider row-by-row judgment, and only two adjacent data banks are used in the processing process, thereby greatly reducing the complexity of de-rate matching.

For the remaining conditions, as shown in FIG. 9, the soft bits output by the interleaving matrix are respectively 0, 11903, 11902, 11901, 1, 0, 11903, 11902 . . . , repetition is performed after every 5 data banks, during the processing of the latter data bank, the data of the previous data bank have been written into the HARQ, then the latter data bank can directly read corresponding data from the HARQ, and the repetitive rate matching and combining processing is naturally completed. It is also unnecessary to perform judgment on the repetitive rate matching, thereby improving the efficiency of de-rate matching.

(3) De-Rate Matching and HARQ Combining When each CB is newly transmitted, during initialization processing, it is necessary to clear all banks to be combined stored in the HARQ memory corresponding to the CB, and relevant addresses can be directly written to 0, or the corresponding banks to be combined of the CB are buffered by identification of flag bits or any other equivalent methods.

The de-rate matching is actually to read, according to the address ar of the de-interleaving arbitration module and from the HARQ memory, Zs soft bits corresponding to the address ar, that is, the bank to be combined. The 2 groups of Zs soft bits formed in the third data bank and the bank to be combined are in one-to-one correspondence and are respectively combined in parallel, and Zs HARQ combining modules are required for parallel processing. After the combining is completed, Zs combined results, that is, the first data banks, will be written into the bank location of the LDPC decoder with the address of $2+(ar/2^m)$, and the soft bits of the first data banks are sequentially written into the location of the bank location with the address ar $\%2^m$. In fact, when stored in the decoder, the soft bits are stored according to the bank, that is, the first data banks are written into a matched bank location, and the addressing of the bank location is implemented as a shift selector, which is simple to implement. At the same time, the first data banks are written back into the HARQ memory corresponding to ar, and the corresponding bank to be combined is overwritten.

In addition, during the de-rate matching processing of the third data bank, the following de-puncturing processing is also performed in turn with the bank as the unit:

3.1) the previous 2Zc bits of the system bits are fixedly punctured, regardless whether it is repetitive rate matching, 0 needs to be written into all banks with the LDPC address of $0-2^{m+1}-1$ to form zero setting banks.

3.2) If K'==K, the step is skipped, and otherwise, the following processing is required:

acquiring the filler bits to generate the filler bank, wherein the bank encoding location ap corresponding to the filler bank is actually a value in an address interval Kp_nZs-Kp_nZs-1 in the encoded data; and sequentially writing the filler bits into the bank location of the LDPC decoder with the address of $2+(ap/2^m)$, and sequentially writing the soft bits of the filler bank into the location in the bank location with the address of ap $\% 2^m$, wherein the write value of each soft bit is a positive maximum value that can be represented.

3.3) If there is repetitive rate matching, that is, $E \geq N_{cb}-(K-K')$, or ks_nZs[0] and ks_oZs[0] are both equal to 0, the step is skipped; and otherwise, the following processing is performed:

acquiring, from the HARQ memory, the pre-redundancy-version punctured bits that match the bank encoding location ap, so as to generate the pre-redundancy-version bank, wherein the bank encoding location ap of the pre-redundancy-version bank is actually a value in an address interval 0-k_nZs[0]-1 in the encoded data; and sequentially writing the pre-redundancy-version punctured bits into the bank location of the LDPC decoder with the address of $2+(ap/2^m)$, and sequentially writing the soft bits in the bank into the location in the bank location with the address of ap $\% 2^m$.

3.4) If there is repetitive rate matching, that is, $E \geq N_{cb}-(K-K')$, or $E+k_0 \geq N_{cb}$, the step is skipped; and otherwise, the following processing is performed:

acquiring, from the HARQ memory, the post-redundancy-version punctured bits that match the bank encoding location ap, so as to generate the post-redundancy-version bank, wherein the bank encoding location ap of the post-redundancy-version bank is actually a value in an address interval k1_nZs-Nr_nZs in the encoded data; and sequentially writing the post-redundancy-version punctured bits into the bank location of the LDPC decoder with the address of $2+(ap/2^m)$, and sequentially writing the soft bits in the bank into the location in the bank location with the address of ap $\% 2^m$.

Thus, the first data banks and the second data banks are stored according to the location relationship in the encoded data, and are arranged and spliced into the data to be decoded, so that the decoder can decode the same to obtain the decoded data.

Specifically, the time sequence can refer to FIG. 6, a rectangle is a clock period, at this time, Q represents four clock periods, and P represents two clock periods. After every two clock periods, the de-interleaving arbitration module selects a third data bank and inputs the same into the de-rate matching module for processing. In the duration shown in FIG. 6, the de-interleaving arbitration module serially inputs the selected 7 third data banks into the de-rate matching module for sequential processing. Specifically, within the period of the first P, in the HARQ memory, the query of the bank to be combined is started according to the $0^{th}$ third data bank; within the period of the second P, the bank to be combined that matches the $0^{th}$ third data bank is acquired; within the period of the third P, soft combining is performed on the $0^{th}$ third data bank, and at the same time, the query of the bank to be combined is started according to the first third data bank; within the period of the fourth P, the first data bank formed by soft combining of the $0^{th}$ third data bank is written back into the HARQ memory and/or into the decoder, and at the same time, the bank to be combined that matches the first third data bank is acquired, and so on. Furthermore, the second data bank can be generated and stored in the decoder within the period of any P.

Figure 10:
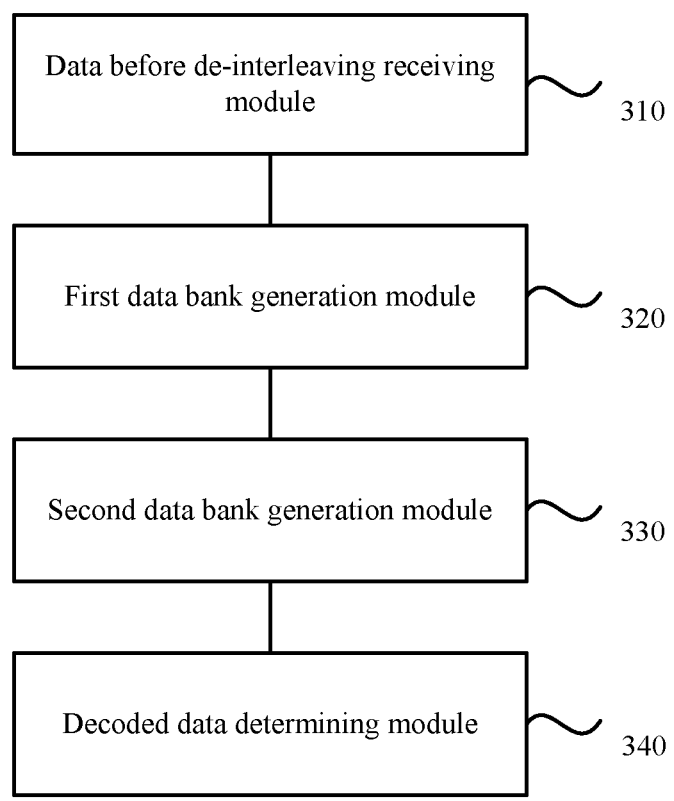
FIG. 10 is a schematic diagram of a decoding apparatus in an embodiment of the present disclosure.

FIG. 10 is a schematic diagram of a decoding apparatus provided by an embodiment of the present disclosure. The present embodiment is a corresponding apparatus for implementing the decoding method provided by any of the above-mentioned embodiments of the present disclosure, and the apparatus can be arranged in a network device.

The decoding apparatus includes:

a data before de-interleaving receiving module 310, configured to receive data before de-interleaving and soft bit encoding locations;

a first data bank generation module 320, configured to divide the data before de-interleaving to obtain first data banks;

a second data bank generation module 330, configured to acquire punctured data, and obtain second data banks according to the punctured data, wherein the data before de-interleaving and the punctured data are determined in encoded data according to the soft bit encoding locations; and a decoded data determining module 340, configured to perform decoding according to the soft bit encoding locations, the first data banks and the second data banks, so as to obtain decoded data.

According to the decoding method and apparatus, the network device and the storage medium provided by the embodiments of the present disclosure, by dividing the soft bits in the data before de-interleaving to form the first data banks, acquiring the punctured data at the same time, and performing soft bit division to generate a plurality of second data banks, forming the data to be decoded according to the soft bit encoding locations, the first data banks and the second data banks, and performing decoding, a bank is formed by a plurality of soft bits for processing, the problem in the prior art is solved that the soft bits need to be processed one by one in a de-rate matching process, resulting in low de-rate matching efficiency, the situation of individually addressing the soft bits one by one in the de-rate matching and decoding processes can be reduced, and the de-rate matching efficiency and the decoding efficiency can be improved.

In an embodiment, the decoded data determining module 340 is further configured to: determine bank encoding locations of respective first data banks according to the soft bit encoding locations and first soft bits in the respective first data banks; determine bank encoding locations of the second data banks according to the soft bit encoding locations and first soft bits in the second data banks; and respectively store, according to the bank encoding locations, the first data banks and the second data banks at matched storage addresses in a decoder, so as to arrange the first data banks and the second data banks to form data to be decoded, so that the decoder decodes the data to be decoded.

In an embodiment, a bank length of the first data bank and a bank length of the second data bank are both a target length, and the target length is determined according to a lifting size.

In an embodiment, the target length is a ratio of the lifting size to the power of a set value of 2, the target length is less than or equal to a set number threshold, and the set number threshold is determined according to an operating frequency and available resources.

In an embodiment, the first data bank generation module 320 is further configured to: receive, in multiple paths in parallel, soft bits output by a de-interleaving matrix in columns; sequentially store the soft bits received in each path to generate a plurality of third data banks; and sequentially perform soft combining on respective third data banks according to a set period number of clock periods, so as to form the first data banks.

In an embodiment, the first data bank generation module 320 is further configured to: in a case where a received target soft bit satisfies a filler bit starting adjacent condition, take the target soft bit as the last received soft bit to generate the current third data bank, and continue to receive the next soft bit to generate the next third data bank.

In an embodiment, the first data bank generation module 320 is further configured to: query, in a set to be combined and according to the bank encoding location corresponding to the third data bank, a bank to be combined that matches the third data bank, and perform combining to obtain the first data bank; and update the matched bank to be combined in the set to be combined according to the first data bank, wherein a bank length of the bank to be combined is a target length, the bank to be combined is used for storing historical combined data, and the historical combined data are used to be combined with the soft bits in the third data bank so as to update the soft bits in the third data bank.

In an embodiment, the set period number is the same as a target period number, or is determined according to one-half of the target period number, the set period number is an integer, and the target period number includes the number of clock periods corresponding to a duration that is required starting from performing soft combining on the third data bank to generating the first data bank In an embodiment, the set period number is determined according to one-half of the target period number, and the set period number is an integer; and the first data bank generation module 320 is further configured to: in a case of determining, according to the bank encoding location corresponding to the currently processed third data bank and the bank encoding location corresponding to the previous third data bank, that the first data bank obtained by the currently processed third data bank satisfies a repetitive rate matching condition, determine, according to a bank to be combined corresponding to the previous third data bank, the bank to be combined that matches the currently processed third data bank.

In an embodiment, the second data bank generation module 330 is further configured to: generate a plurality of zero setting banks, wherein soft bits in each zero setting bank are zero, a bank length of each zero setting bank is a target length, a total number of soft bits in the plurality of zero setting banks is a product of a lifting size and 2, and the bank encoding location corresponding to each zero setting bank is in front of the bank encoding location corresponding to each first data bank; in a case where there are filler bits in the encoded data, acquire the filler bits, and generate a filler bank, wherein a bank length of the filler bank is the target length; in a case where there are first data banks that satisfy a repetitive rate matching condition or there are pre-redundancy-version punctured bits in the encoded data, acquire pre-redundancy-version bits, and generate pre-redundancy-version banks, wherein a bank length of each pre-redundancy-version bank is the target length, and a bank encoding location corresponding to each pre-redundancy-version bank is in front of the bank encoding location corresponding to each first data bank; and in a case where there are first data banks that satisfy the repetitive rate matching condition or there are post-redundancy-version punctured bits in the encoded data, acquire post-redundancy-version bits, and generate post-redundancy-version banks, wherein a bank length of each post-redundancy-version bank is the target length, and a bank encoding location corresponding to each post-redundancy-version bank is behind the bank encoding location corresponding to each first data bank.

The above-mentioned decoding apparatus can execute the decoding method provided by the embodiment of the present disclosure, and has functional modules and beneficial effects corresponding to the executed decoding method.

The present disclosure provides a network device, wherein the network device includes a processor and a memory; and the at least one processor is configured to execute a program stored in the memory, so as to implement the method in the above-mentioned embodiment. The network device is a power supply device that supplies power to the device.

As a computer-readable storage medium, the memory can be configured to store software programs, computer-executable programs and modules, such as program instructions/modules corresponding to the decoding method in the embodiment of the present disclosure.

The memory can mainly include a program storage area and a data storage area, wherein the program storage area can store an operating system, and an application program required by at least one function; and the data storage area can store data created according to the use of the device, etc. In addition, the memory can include high-speed random access memory, and can also include a non-volatile memory, such as at least one magnetic disk storage device, a flash memory device, or other non-volatile solid state storage devices. In some instances, the memory can further include memories that are remotely disposed relative to the at least one processor, and these remote memories can be connected to the device by means of a network. Instances of the network include, but are not limited to, the Internet, an intranet, a local area network, a mobile communication network and combinations thereof.

The present disclosure provides a storage medium, on which a computer program is stored, and when executed by a processor, the computer program implements the method in the above-mentioned embodiment.

The computer storage medium in the embodiment of the present invention can utilize any combination of one or more computer-readable media. The computer-readable medium can be a computer-readable signal medium or a computer-readable storage medium. The computer-readable storage medium can be, for example, but not limited to, electrical, magnetic, optical, electromagnetic, infrared, or semiconductor systems, apparatuses or devices, or a combination of any of the above. More specific examples (non-exhaustive list) of the computer-readable storage medium include: an electrical connection having one or more conducting wires, a portable computer disk, a hard disk, an Random Access Memory (RAM), a Read Only Memory (ROM), an Erasable Programmable Read Only Memory (EPROM), a flash memory, an optical fiber, a portable CD-ROM, an optical storage device, a magnetic storage device, or any suitable combination of the above. In this document, the computer-readable storage medium can be any tangible medium that includes or stores a program, and the program can be used by or in conjunction with an instruction execution system, apparatus or device.

The computer-readable signal medium can include data signals that are propagated in a baseband or as part of a carrier, and computer-readable program codes are carried therein. Such propagated data signals can take a variety of forms, including, but not limited to, electromagnetic signals, optical signals, or any suitable combination of the above. The computer-readable signal medium can also be any computer-readable medium other than the computer-readable storage medium, and the computer-readable medium can send, propagate or transmit a program that is used by or in connection with the instruction execution system, apparatus or device.

The program codes included in the computer-readable medium can be transmitted by using any suitable medium, including, but not limited to, wireless, wire, optical cable, radio frequency (Radio Frequency, RF), and the like, or any suitable combination of the above.

The computer program codes for executing the operations of the present invention can be written in one or more programming languages, the programming languages include object-oriented programming languages, such as Java, Smalltalk, C++, as well as conventional procedural programming languages, such as the "C" language or similar programming languages. The program codes can be entirely executed on a user computer, partly executed on the user computer, executed as a stand-alone software package, partly executed on the user computer and partly executed on a remote computer, or entirely executed the remote computer or a server. When the remote computer is involved, the remote computer can be connected to the user computer through any kind of network, including a LAN or a WAN, or can be connected to an external computer (e.g., connected by using an Internet service provider and by means of the Internet).

The above descriptions are merely exemplary embodiments of the present disclosure, and are not intended to limit the protection scope of the present disclosure.

Those skilled in the art should understand that, the term user terminal encompasses any suitable type of wireless user equipment, such as a mobile telephone, a portable data processing apparatus, a portable web browser or a vehicle-mounted mobile station.

In general, a variety of embodiments of the present disclosure can be implemented in hardware or dedicated circuits, software, logic, or any combination thereof. For example, some aspects can be implemented in hardware, while other aspects can be implemented in firmware or software that can be executed by a controller, a microprocessor or other computing apparatuses, although the present disclosure is not limited thereto.

The embodiments of the present disclosure can be implemented by a data processor of a mobile apparatus by means of executing computer program instructions, for example, in a processor entity, or by hardware, or by a combination of software and hardware. The computer program instructions can be assembly instructions, Instruction Set Architecture (ISA) instructions, machine instructions, machine related instructions, microcodes, firmware instructions, state setting data, or source codes or target codes that are written in any combination of one or more programming languages.

The block diagram of any logic flow in the drawings of the present disclosure can represent program steps, or can represent interconnected logic circuits, modules and functions, or can represent a combination of program steps and logic circuits, modules and functions. The computer program can be stored on the memory. The memory can be of any type suitable for the local technical environment and can be implemented by using any suitable data storage technology, for example, but not limited to, a Read-Only Memory (ROM), a Random Access Memory (RAM), and an optical memory apparatus and system (a Digital Video Disc (DVD) or a Compact Disk (CD)), etc. The computer-readable medium can include a non-transitory storage medium. The data processor can be of any type suitable for the local technical environment, for example, but not limited to, a general-purpose computer, a special-purpose computer, a microprocessor, a Digital Signal Processor (DSP), an Application Specific Integrated Circuit (ASIC), a Field-Programmable Gate Array (FGPA), and a processor based on a multi-core processor architecture.

The detailed description of the exemplary embodiments of the present disclosure has been provided above by way of illustrative and non-limiting examples. However, considering the drawings and claims, various modifications and adjustments to the above embodiments will be obvious to those skilled in the art, but do not deviate from the scope of the present invention.

Accordingly, the proper scope of the present invention will be determined with reference to the claims.

What is claimed is:

1. A decoding method, comprising:
   receiving data before de-interleaving and soft bit encoding locations;
   dividing the data before de-interleaving to obtain first data banks;
   acquiring punctured data, and obtaining second data banks according to the punctured data, wherein the data before de-interleaving and the punctured data are determined in encoded data according to the soft bit encoding locations; and
   performing decoding according to the soft bit encoding locations, the first data banks and the second data banks, so as to obtain decoded data, wherein performing decoding according to the soft bit encoding locations, the first data banks and the second data banks, so as to obtain the decoded data comprises: determining bank encoding locations of respective first data banks according to the soft bit encoding locations and first soft bits in the respective first data banks; determining bank encoding locations of the second data banks according to the soft bit encoding locations and first soft bits in the second data banks; respectively storing, according to the bank encoding locations, the first data banks and the second data banks at matched storage addresses in a decoder, so as to arrange the first data banks and the second data banks to form data to be decoded; and decoding the data to be decoded by the decoder.

2. The method according to claim 1, wherein a bank length of the first data bank and a bank length of the second data bank are both a target length, and the target length is determined according to a lifting size.

3. A decoding method, comprising:
   receiving data before de-interleaving and soft bit encoding locations;
   dividing the data before de-interleaving to obtain first data banks;
   acquiring punctured data, and obtaining second data banks according to the punctured data, wherein the data before de-interleaving and the punctured data are determined in encoded data according to the soft bit encoding locations, a bank length of the first data bank and a bank length of the second data bank are both a target length, the target length is a ratio of the lifting size to the power of a set value of 2, the target length is less than or equal to a set number threshold, and the set number threshold is determined according to an operating frequency and available resources; and
   performing decoding according to the soft bit encoding locations, the first data banks and the second data banks, so as to obtain decoded data.

4. A network device, wherein the network device comprises at least one processor and a memory; and
   the at least one processor is configured to execute a program stored in the memory, so as to implement the method according to claim 3.

5. A non-transitory computer-readable storage medium, wherein a computer program is stored in the non-transitory computer-readable storage medium, and when executed by a processor, the computer program implements the method according to claim 3.

6. The method according to claim 1, wherein receiving the data before de-interleaving and dividing the data before de-interleaving to obtain the first data banks comprises:
   receiving, in multiple paths in parallel, soft bits output by a de-interleaving matrix in columns;
   sequentially storing the soft bits received in each path to generate a plurality of third data banks; and
   sequentially performing soft combining on respective third data banks according to a set period number of clock periods, so as to form the first data banks.

7. The method according to claim 6, wherein sequentially storing the soft bits received in each path to generate the plurality of third data banks comprises:
   in a case where a received target soft bit satisfies a filler bit starting adjacent condition, generating a current third data bank by taking the target soft bit as the last received soft bit, and continuing to receive the next soft bit to generate the next third data bank.

8. The method according to claim 6, wherein performing soft combining on the third data bank to form the first data bank comprises:
   querying, in a set to be combined and according to the bank encoding location corresponding to the third data bank, a bank to be combined that matches the third data bank, and performing combining to obtain the first data bank; and
   updating the matched bank to be combined in the set to be combined according to the first data bank, wherein a bank length of the bank to be combined is a target length, the bank to be combined is used for storing historical combined data, and the historical combined data are used to be combined with the soft bits in the third data bank so as to update the soft bits in the third data bank.

9. The method according to claim 6, wherein the set period number is the same as a target period number, or is determined according to one-half of the target period number, the set period number is an integer, and the target period number comprises the number of clock periods corresponding to a duration that is required starting from performing soft combining on the third data bank to generating the first data bank.

10. The method according to claim 9, wherein the set period number is determined according to one-half of the target period number; and
    performing soft combining on the third data bank to form the first data bank comprises:
    in a case of determining, according to the bank encoding location corresponding to the currently processed third data bank and the bank encoding location corresponding to the previous third data bank, that the first data bank obtained by the currently processed third data bank satisfies a repetitive rate matching condition, determining, according to a bank to be combined corresponding to the previous third data bank, the bank to be combined that matches the currently processed third data bank.

11. The method according to claim 1, wherein acquiring the punctured data and generating the second data banks according to the punctured data comprises:

generating a plurality of zero setting banks, wherein soft bits in each zero setting bank are zero, a bank length of each zero setting bank is a target length, a total number of soft bits in the plurality of zero setting banks is a product of a lifting size and 2, and the bank encoding location corresponding to each zero setting bank is in front of the bank encoding location corresponding to each first data bank;

in a case where there are filler bits in the encoded data, acquiring the filler bits, and generating a filler bank, wherein a bank length of the filler bank is the target length;

in a case where there are first data banks that satisfy a repetitive rate matching condition or there are pre-redundancy-version punctured bits in the encoded data, acquiring pre-redundancy-version bits, and generating pre-redundancy-version banks, wherein a bank length of each pre-redundancy-version bank is the target length, and a bank encoding location corresponding to each pre-redundancy-version bank is in front of the bank encoding location corresponding to each first data bank; and in a case where there are first data banks that satisfy the repetitive rate matching condition or there are post-redundancy-version punctured bits in the encoded data, acquiring post-redundancy-version bits, and generating post-redundancy-version banks, wherein a bank length of each post-redundancy-version bank is the target length, and a bank encoding location corresponding to each post-redundancy-version bank is behind the bank encoding location corresponding to each first data bank.

12. A network device, wherein the network device comprises at least one processor and a memory; and the at least one processor is configured to execute a program stored in the memory, so as to implement the method according to claim 1.

13. A non-transitory computer-readable storage medium, wherein a computer program is stored in the non-transitory computer-readable storage medium, and when executed by a processor, the computer program implements the method according to claim 1.

* * * * *